United States Patent [19]
Endo et al.

[11] Patent Number: 5,352,657
[45] Date of Patent: Oct. 4, 1994

[54] BISMUTH SYSTEM OXIDE SUPERCONDUCTORS AND PREPARATION THEREOF

[75] Inventors: Utako Endo, Settsu; Satoshi Koyama, Osaka; Kazuo Okamura, Itami; Tomoji Kawai, Ibaraki; Koichi Kitazawa, Tokyo, all of Japan

[73] Assignee: Daikin Industries Ltd., Osaka, Japan

[21] Appl. No.: 865,637

[22] Filed: Apr. 9, 1992

Related U.S. Application Data

[63] Continuation of Ser. No. 366,687, Jun. 15, 1989, abandoned.

[30] Foreign Application Priority Data

| Jun. 20, 1988 | [JP] | Japan | 63-152505 |
| Jun. 20, 1988 | [JP] | Japan | 63-152506 |
| Jun. 20, 1988 | [JP] | Japan | 63-152507 |
| Aug. 30, 1988 | [JP] | Japan | 63-218188 |
| Oct. 28, 1988 | [JP] | Japan | 63-273776 |

[51] Int. Cl.$^5$ .................... H01B 12/00; H01L 39/00
[52] U.S. Cl. .................... 505/501; 505/782; 505/737; 252/518; 252/521
[58] Field of Search .................... 505/782, 737, 742; 252/518, 521

[56] References Cited

U.S. PATENT DOCUMENTS

| 4,880,771 | 11/1989 | Cava et al. | 252/512 |
| 4,898,851 | 2/1990 | Michel | 505/1 |
| 4,900,716 | 2/1990 | Fujita | 505/742 |

OTHER PUBLICATIONS

Chu "Evidence for Superconductivity above 40K in the La-Ba-Cu-O . . . " Phy. Rev. Lett. v. 58(4) Jan. 26, 1987 pp. 406–408.
Matthews "Increased transistion temperatures in YBa$_2$Cu$_3$O$_y$ . . . " Nature v. 328 Aug. 27, 1987 pp. 786–787.
Endo "Preparation of the High-tc Phase at Bi-Sr-Ca-Cu-O . . . " Jnp. Jnl. Appl. Phys. v. 27(8) Aug. 1988 pp. L1476–L1479.
Cava "Bulk Superconductivity at 91K in Single-Phase . . . Ba$_2$YC$_3$O$_{9-y}$ Phys. Rev. Lett." v. 58(16) Apr. 20, 1987 pp. 16–18.
Tajima "Composition dependence of the Physical Properties . . . " Jap. Jnl. Appl. Phys. v. 26(5) May 1987 pp. L845–L847.
Uno "Synthesis at Bi-Sr-Ca-Cu-O Superconductor by vacuum calculation . . . " Jnp. Jnl. Appl. Phys. v. 26(6) Jun. 1987 pp. L1013–L1016.
Minami "Glass formation at High-Tc Compound Bi-CaSrCuO$_x$ by . . . " Jnp. Jnl. Appl. Phys. v. 27(5) May 1988 pp. L777–778.
Nakao "Magnetron Sputtering of Bi-Ca-Sr-Cu-O thin films . . . " Jnp. Jnl. Appl. Phys. v. 27(3) Mar. 1988 pp. L378–L380.
Togano "Preparation of high-Tc Bi-Sr-Ca-Cu-O Superconductors" Jnp. Jnl. Appl. Phys. v. 27(3) Mar. 1988 pp. L323–L324.
Kayser "Preparation of high Tc YBa$_2$Cu$_3$O$_{7-x}$ powders from nitrate . . . " Mat. Res, Soc. Symp. Proc. v. 99 Dec. 1987 pp. 159–164.
Tan "TEM Study of Superconductivity (Pb, Bi)$_2$(Sr,Ca)$_3$Cu$_2$O$_y$" Ceramic Development: Nat'l Sci Forum Proc. Aug. 1988 pp. 351–354.

(List continued on next page.)

Primary Examiner—Paul Lieberman
Assistant Examiner—M. Kopec
Attorney, Agent, or Firm—Birch, Stewart, Kolasch & Birch

[57] ABSTRACT

A bismuth system oxide superconductor comprising the 110 K phase is effectively prepared by a process comprising the steps of mixing a bismuth compound, a strontium compound, a calcium compound, a copper compound and optionally a lead compound, optionally provisionally sintering the mixture, and sintering the mixture.

13 Claims, 14 Drawing Sheets

EX.1

OTHER PUBLICATIONS

Lundy "Magnetic Properties of a Chemically Synthesized Bi(Pb)SrCaCuO . . . " *Prog. in High Temp. Super vol. 17 Symp. Oct. 11–13 1988 pp. 263–268.*

Yamada "Pb Introduction to the High–Tc Superconductor Bi–Sr–Ca–Cu–O" *Jnp. Jnl. Appl. Phys. vol. 27 No. 6 Jun. 1988 pp. L996-998.*

Takano "High–Tc Phase Promoted and Stabilized in the Bi,Pb–Sr–Ca–Cu–O . . . " *Jnp. Jnl. Appl. Phys. vol. 27(6) Jun. 1988 pp. L1041–L1043.*

Ausloos "Evidence for Anomalous Fluctuations in Superconducting . . . " *Modern Phys. Lett. B vol. 2 No. 11 & 12 Dec. 1988 pp. 1319–1325.*

Rao "$Bi_{2-x}Pb_x(Ca, Sr)_{n+1}Cu_nO_{2n+4+\delta}$ (n=1, 2, 3 and 4) Family of Super. . . . " *Journal of Solid State Chem.* vol. 79 Mar. 1989 pp. 177–180.

Hewat "HREM Study of Bi–oxide based High Tc Supercondcutor" *J. Microsc. Spectrosc. Electron,* vol. 13 1988 (May 17–20) pp. 297–305.

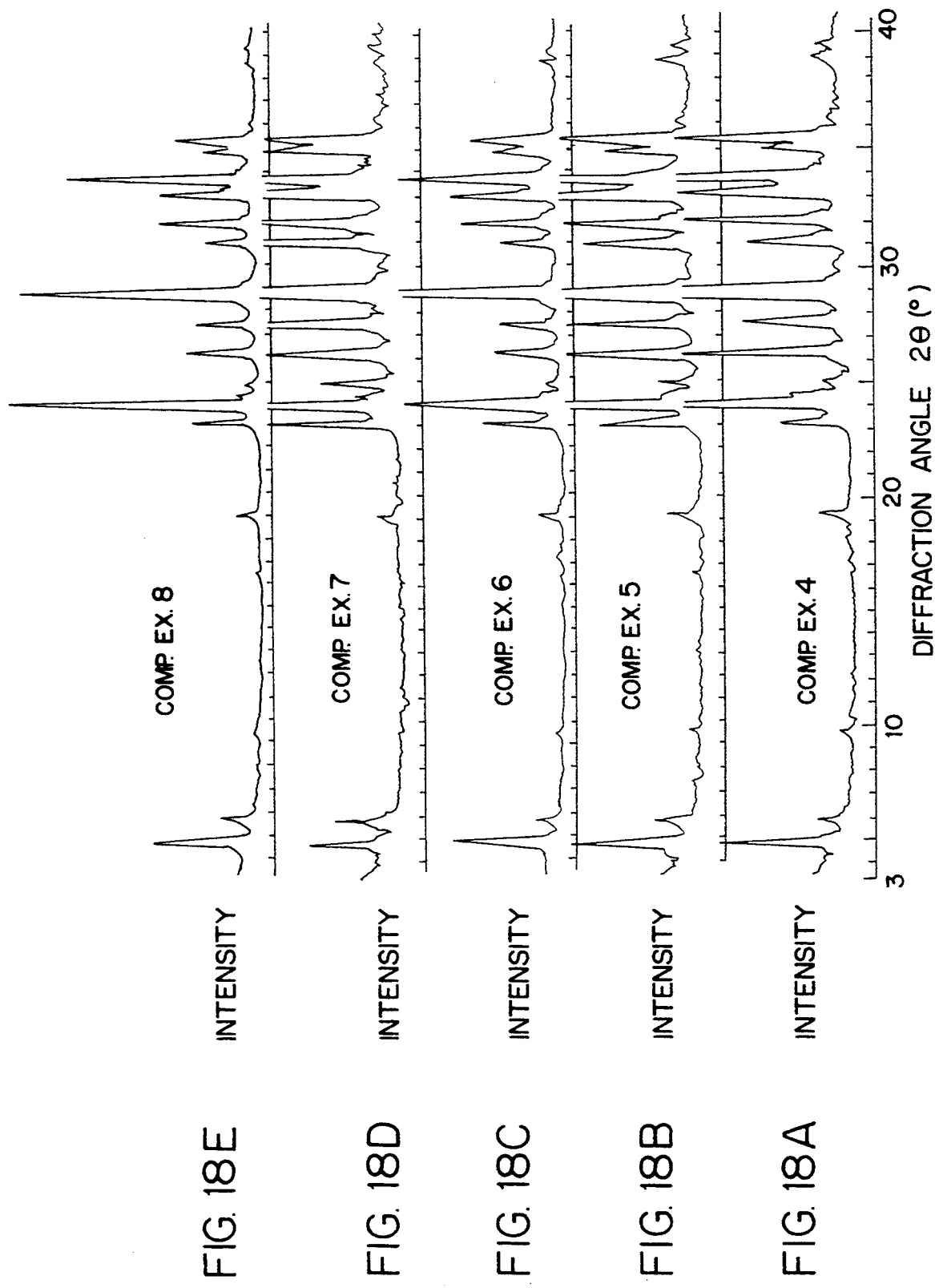

BISMUTH SYSTEM OXIDE SUPERCONDUCTORS AND PREPARATION THEREOF

This application is a continuation of application Ser. No. 07/366,687, filed on Jun. 15, 1989, now abandoned, the entire contents of which are incorporated by reference.

BACKGROUND OF THE INVENTION

1. Field of the Invention

The present invention relates to bismuth system oxide superconductors and the preparation thereof. More particularly, the present invention relates to bismuth system oxide superconductors comprising the 110K phase.

2. Description of the Related Art

The bismuth system oxide superconductor was found in January 1988 by Maeda et al (Jap. J. Appl. Phys., 27, (1988) L209). With this bismuth system oxide, a sharp decrease of electrical resistance was observed around 110K and also the Meissner effect was observed in the same temperature range. Since the critical temperature of 110K is much higher than 90K of $YBa_2Cu_3O_y$, which had been believed to have the highest critical temperature, the bismuth system oxide is expected to find various applications in future.

It is known that a phase of the bismuth system oxide having the critical temperature of 110K can be isolated as a single crystal. However, the isolated single crystal cannot be used as a superconductive material. Thus, it can be said that at the time of finding by Maeda et al, no practically usable material consisting of a single phase of the bismuth system oxide having the critical temperature of 110K was produced, and the produced material contained impurities such as a 80K phase or a semiconductive phase and $Ca_2PbO_4$. In addition, the X-ray diffraction pattern of the bismuth system oxide had weak diffraction peaks other than that assigned to the 110K phase, although compounds to which such weak diffraction peaks are assigned were not specified. Since the presence of several phases in the material seriously deteriorates the superconductive properties, it was desired to provide a superconductive material essentially consisting of the 110K phase.

To increase the proportion of the 110K phase in the bismuth system oxide, it was proposed to heat said oxide. However, the heating took long time. For example, it took several days at 880° C. in the air (presentation in the International Conference on High Temperature Superconductors and Material and Mechanisms of Superconductivity held on Feb. 29 to Mar. 4, 1989 in Interlaken, Switzerland), or eleven days in the air (90th Annual Meeting of the American Ceramics Society held on May 1 to 5, 1988 in Cincinnati, Ohio, U.S.A.). Some other measures to increase the proportion of the 110K phase were reported. For example, Takano et al proposed the addition of lead (Pb), and Kijima et al proposed the variation of the composition. Although they achieved some improvements, their process requires a long reaction time, for example, 244 hours in the air by Takano et al or 120 hours in the air by Kijima et al.

In the practical production of the oxide superconductive materials, the decrease of the reaction temperature is one of the important requirements. In the field of semiconductors, the oxide superconductor should be produced at a sintering temperature as low as possible so as not to deteriorate properties of silicon substrates. In a case of Y-system and Tl-system oxides, the bulk materials should be sintered at about 900° C. and 1,000° C., respectively. Although the bismuth system oxide can be sintered at a comparatively low temperature, the sintering temperature is still about 870° C.

SUMMARY OF THE PRESENT INVENTION

One object of the present invention is to provide a process for effectively producing a bismuth system oxide having a larger proportion of the 110K phase in a comparatively short time.

Another object of the present invention is to provide a process for producing a bismuth system oxide superconductor in which a raw material mixture can be sintered at a comparatively low temperature.

Another object of the present invention is to provide a bismuth system oxide superconductor consisting essentially of the 110K phase.

Accordingly, the present invention provides a process for producing a bismuth system oxide superconductor, which process comprising steps of mixing a bismuth compound, a strontium compound, a calcium compound, a copper compound and optionally a lead compound, optionally provisionally sintering the mixture, and sintering the mixture.

Also, the present invention provides a bismuth system oxide superconductive material comprising bismuth, lead, strontium, calcium, copper and oxygen atoms, the X-ray diffraction pattern of which measured with the Cu-K$_\alpha$ line has a diffraction line at $2\theta$ of about 4.7°, wherein neither of the diffraction lines at $2\theta$ of about 5.7° and about 7.2° has intensity larger than 5% of that at $2\theta$ of about 4.7°.

BRIEF DESCRIPTION OF THE DRAWINGS

FIGS. 18A–18E show the X-ray diffraction patterns of the bismuth system oxides produced in Comparative Examples 4, respectively.

DETAILED DESCRIPTION OF THE INVENTION

Figures 1A, 1B:
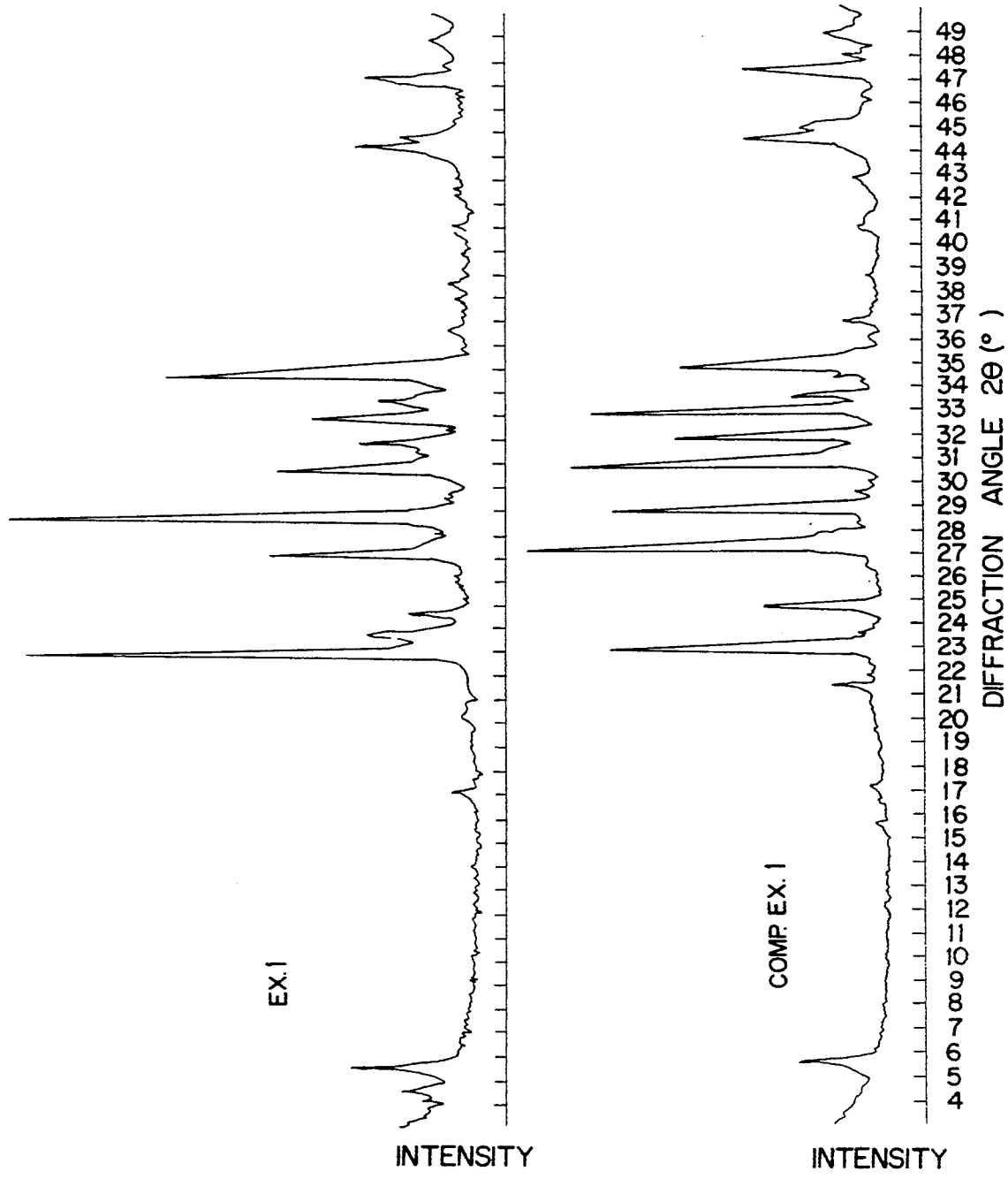
FIGS. 1A and 1B show the X-ray diffraction patterns of the bismuth system oxides prepared in Example 1 and Comparative Example 1, respectively.

The bismuth system oxide superconductor of the present invention comprises bismuth, strontium, calcium, copper and oxygen atoms. A part of the bismuth atoms may be replaced with lead atoms.

Depending on the composition of these atoms, the bismuth system oxide has different performances. For example, in the lead-free system, when the atomic ratio of Bi:Sr:Ca:Cu is 1:1:1:2, the proportion of the 110K phase is maximum. When said atomic ratio is 2:2:1:2, the 80K phase dominates in the bismuth system oxide.

Preferably, the atomic ratio of strontium to bismuth is from 0.8 to 1.2, that of calcium to bismuth is from 1 to 4, that of copper to bismuth is from 1.5 to 5. When the lead atoms are contained in the bismuth system oxide, the atomic ratio of lead to bismuth is from 0.1:0.9 to 0.4:0.6.

The bismuth system oxide superconductive material may include the 110K phase, the 80K phase and the semiconductive phase. In the X-ray diffraction pattern, diffraction lines to be assigned to the 110K phase, the 80K phase and the semiconductive phase appear at $2\theta$ of about 4.7°, about 5.7° and about 7.2°, respectively. In addition, a diffraction line to be assigned to $Ca_2PbO_4$ which is contained as an impurity appears at $2\theta$ of 17.8°. In some cases, a weak diffraction line which may be assigned to other impurities may appear at $2\theta$ of 16.5°.

In the bismuth system oxide superconductor containing the lead atoms according to the present invention, the diffraction lines at $2\theta$ of about 5.7° and about 7.2° should be 5% or less of that at $2\theta$ of about 4.7°. To achieve this condition, the bismuth system oxide preferably has the composition of

$Bi_xPb_y(Sr_uCa_vCu_w)_zO_\alpha$ wherein x is a number of from 0.150 to 0.215, y is a number of 0.030 to 0.090 and z is a number of 0.720 to 0.800 provided that the sum of x, y and z is 1 (one); and u is a number of from 0.200 to 0.290, v is a number of from 0.250 to 0.355 and w is a number of from 0.430 to 0.530 provided that the sum of u, v and w is 1 (one) and $\alpha$ is a number from 0.8 to 1.3. To obtain the superconductive material having no impurity, preferably x is a number of from 0.185 to 0.210, y is a number of 0.030 to 0.050 and z is a number of 0.750 to 0.770 provided that the sum of x, y and z is 1; u is a number of from 0.255 to 0.290, v is a number of from 0.275 to 0.310 and w is a number of from 0.430 to 0.455 provided that the sum of u, v and w is 1; and $\alpha$ is a number from 0.8 to 1.3.

Another feature of the bismuth system oxide superconductive material of the present invention resides in that it includes a phase which becomes superconductive in a temperature range of 90 to 100K (hereinafter referred to as "95K phase"). In such case, the diffraction line may appear at $2\theta$ of about 5.7° and/or about 7.2°. Further, the superconductive material may contain the impurities. Since the 95K phase provides the diffraction line at $2\theta$ of about 4.7°, it is substantially the same as the 110K phase from the view point of the X-ray diffraction pattern.

The 110K phase has a higher critical temperature but small critical current. Therefore, the critical temperature should be measured with a very small current. Otherwise, a tail appears in the lower temperature side and the apparent critical temperature is measured lower than the actual one. Although the 95K phase has the lower critical temperature than the 110K phase, the former has a strong pinning effect than the latter and therefore the former has the large critical current $J_c$.

The raw materials for supplying the above atoms in the bismuth system oxide may be any inorganic compounds such as hydroxides, oxides, carbonates and nitrates and organic acid salts such as oxalates and acetates insofar as the compounds can be converted to the corresponding oxides by heating. Preferably, at least copper is used in the form of its nitrate, more preferably, all of the raw materials are in the form of nitrates. When the carbonates or oxides are used, they may be dissolved in nitric acid.

The raw materials are homogeneously mixed by any of the conventional methods. For example, the raw materials are ground and mixed in a mortar made of agate or with a ball mill. The raw materials are dissolved or dispersed in water and heated to dryness while stirring. Since bismuth nitrate is hardly soluble in pure water, preferably water is acidified with nitric acid. Further, the solution or dispersion of the raw materials can be spray dried and mixed. Alternatively, a thin film formed by sputtering has a homogeneous composition.

The raw material mixture prepared by the above methods is provisionally sintered before sintering, although the mixture may be sintered without provisional sintering. The mixture of the compounds other than oxides is provisionally sintered at a temperature around 800° C., for example from 800° to 840° C. in an atmosphere of air, oxygen or a mixture of oxygen and an inert gas (e.g. nitrogen, helium, argon, etc.). It is not necessary to provisionally sinter the mixture of oxides or the thin film of oxides or metals formed by sputtering before sintering.

The material is then sintered. When the raw materials are in the powder form, they are molded before sintering. The raw materials may be molded in any shape and/or size. For example, the molded material may be in the form of a pellet, a thin plate or a wire. The sintering is carried out usually in the air. The partial pressure of oxygen may be from 0 (zero) to 0.15 atm., preferably from 0.03 to 0.1 atm. To adjust the oxygen partial pressure, the air or pure oxygen gas may be diluted with the inert gas. The oxygen partial pressure of 0 (zero) means that no oxygen is contained and the sintering atmosphere consists of pure inert gas.

The sintering temperature varies with the oxygen partial pressure and/or the composition of the raw materials. In general, the sintering temperature is from just below the melting point of the raw material to 50° C. below said melting point, preferably 30° C. below said melting point. In the case of the bismuth system oxide, the raw material cannot be reacted at a temperature higher than the melting point, since the once melt material does not have a superconductive property. The melting points of various compositions are as follows:

When the atomic ratio of Bi:Sr:Ca:Cu is 1:1:1:2, the melting point is about 870° C. under the oxygen partial pressure of 0.2 atm., about 850° C. under oxygen partial pressure of 0.03 atm., about 830° C. under oxygen partial pressure of 0.01 atm., or about 810° C. under oxygen partial pressure of 0 (zero). When the atomic ratio of Bi:Pb:Sr:Ca:Cu is 0.8:0.2:0.8:1:1.4, the melting point under the oxygen partial pressure of 0.2 atm. is about 845° C. By decreasing the oxygen partial pressure, the oxide product can be produced in a comparatively short time in a wide temperature range.

The sintering time is at least 2 hours, preferably at least 8 hours, more preferably at least 12 hours.

The sintered oxide material is cooled preferably in an atmosphere having an oxygen partial pressure higher than that in the sintering step, while it may be cooled in the atmosphere having an same oxygen partial pressure as in the sintering step. Through the bismuth system oxide cooled in the atmosphere having the higher oxygen partial pressure, a larger amount of current can flow. In addition, the 110K phase and the 95K phase can be clearly separated in the magnetization measurement by cooling under the higher oxygen partial pressure. Alternatively, the sintered oxide is cooled under the same oxygen partial pressure as in the sintering pressure, heated at a temperature lower than the sintering temperature and treated with oxygen under the higher oxygen pressure.

PREFERRED EMBODIMENTS OF THE INVENTION

The present invention will be illustrated more in detail by the following examples.

EXAMPLE 1

$Bi_2O_3$, $SrCO_3$, $CaCO_3$ and CuO were weighed so that the atomic ratio of Bi:Sr:Ca:Cu was 1:1:1:2 and completely dissolved in excess nitric acid while heating. The solution was charged in an evaporating dish made of platinum and heated while continuous stirring to evaporate the water. During evaporation, excess nitric acid was also removed. The mixture of nitrates was taken in an alumina crucible and further heated, whereby the nitrates were decomposed to liberate $NO_2$. The heating was continued at 800° C. until no further $NO_2$ was liberated. The mixture was ground in an agate mortar and molded in a round plate of 13 mm in diameter and about 1 mm in thickness.

Then, the plate was placed in an alumina boat and set at the center of a tubular furnace of 100 mm in inner diameter and 600 mm in length. Then, the plate was sintered at 867° C. for 12 hours while flowing a mixture of argon and oxygen in a volume ratio of 4:1 at a flow rate of 250 ml/min. The sintered plate was ground and re-molded in a round plate having the same sizes as above. Then, the plate was sintered for 12 hours under the same conditions as above.

The sintered round plate was slightly warped. This indicated that the sintering was carried out just below the melting point. With this sintered sample, an X-ray diffraction pattern, electric resistance and the Meissner effect were measured.

Figure 2:
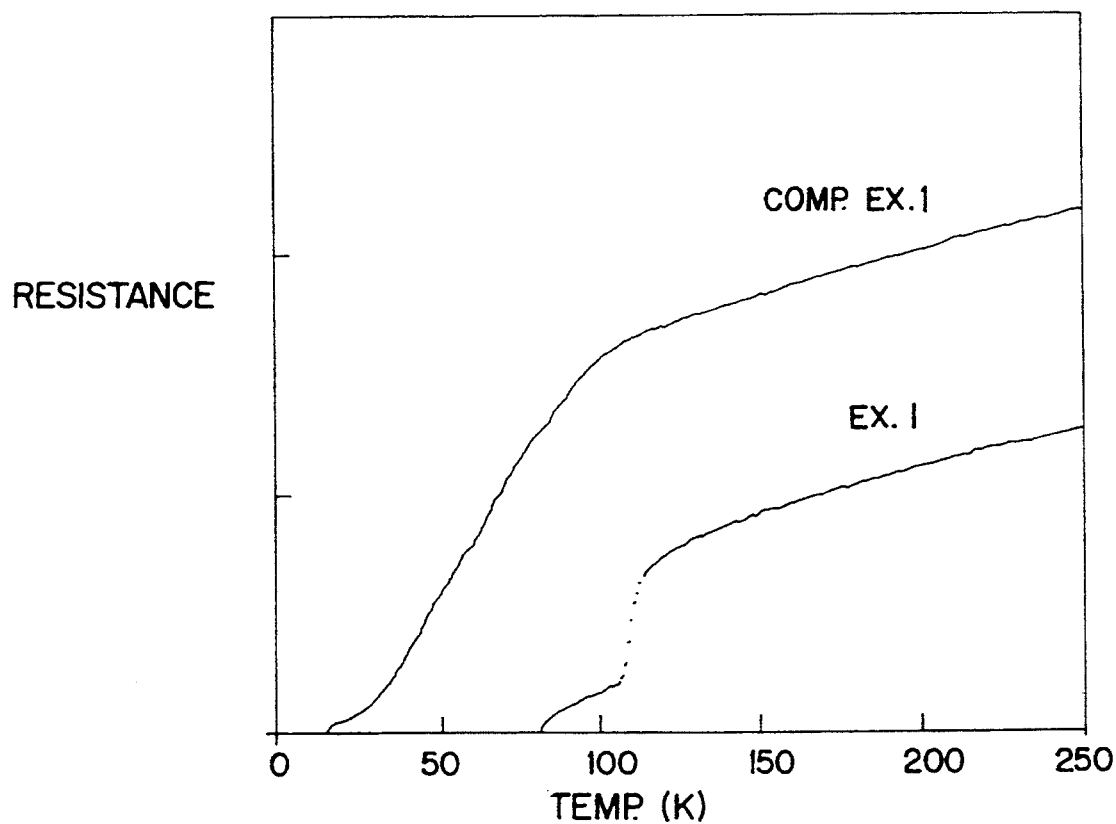
FIG. 2 is a graph showing the temperature dependency of resistance of the bismuth system oxides prepared in Example 1 and Comparative Example 1.
Figure 3:
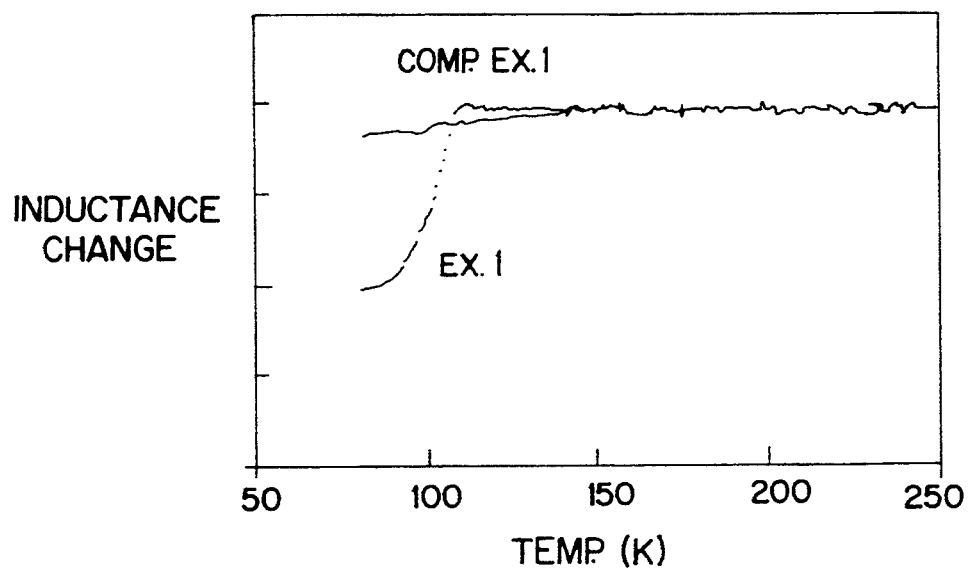
FIG. 3 is a graph showing the temperature dependency of coil inductance change caused by the bismuth system oxides prepared in Example 1 and Comparative Example 1.

The resistance was measured on the sintered plate as such by the standard four probe method. The Meissner effect was measured at room temperature by placing the sample in a coil having an inductance of about 1.7 mH and monitoring the change of inductance. The results are shown in FIGS. 1A, 2 and 3, respectively.

In FIG. 1A, the diffraction line assigned to the (002) plane of the 110K phase appears around $2\theta$ of 4.7°, and the diffraction line assigned to the 80K phase appears around $2\theta$ of 5.7°. In FIGS. 2 and 3, the resistance and the coil inductance change sharply drop around 110K. This indicates the formation of the 110K phase.

Comparative Example 1

$Bi_2O_3$, $SrCO_3$, $CaCO_3$ and CuO were weighed so that the atomic ratio of Bi:Sr:Ca:Cu was 1:1:1:2 and thoroughly mixed in the agate mortar. Then, the mixture was provisionally sintered at 810° C. for 10 hours in a stream of air. Thereafter, the grinding and the three hour provisional sintering were repeated twice. The provisionally sintered material was again ground and molded to obtain a round plate of 13 mm in diameter and about 1 mm in thickness. Then, the plate was sintered under the same conditions as in Example 1.

The sintered round plate was slightly warped. This indicated that the sintering was carried out just below the melting point. With this sintered sample, an X-ray diffraction pattern, resistance and the Meissner effect were measured in the same manner as in Example 1. The results are shown in FIGS. 1B, 2 and 3. In the X-ray diffraction pattern, only the diffraction line at $2\theta$ of 5.7° appeared but no diffraction line at $2\theta$ of 4.7° which is assigned to the 110K phase appeared. The changes of the resistance and the inductance change near 110K were slight, which indicates that the proportion of the 110 K phase was small.

EXAMPLE 2

Nitrates of Bi, Pb, Sr, Ca and Cu were weighed so that the atomic ratio of Bi:Pb:Sr:Ca:Cu was 0.8:0.2:0.8:1.0:1.4 and completely dissolved in water acidified with nitric acid. The solution was charged in an evaporating dish made of platinum and heated while continuously stirring to evaporate the water. The mixture of nitrates was taken in an alumina crucible and further heated, whereby the nitrates were decomposed to liberate $NO_2$. The heating was continued at 800° C. until no further $NO_2$ was liberated. The mixture was ground in an agate mortar and molded in a round plate of 13 mm in diameter and about 1 mm in thickness.

Then, the plate was placed in an alumina boat and set at the center of a tubular furnace of 100 mm in inner diameter and 600 mm in length. Then, the plate was sintered at 828° C. for 12 hours with flowing a mixture of argon and oxygen in a volume ratio of 12:1 at a flow rate of 250 ml/min. The sintered plate was ground and re-molded in a round plate having the same sizes as above. Then, the plate was sintered for 108 hours under the same conditions as above.

Figure 4:
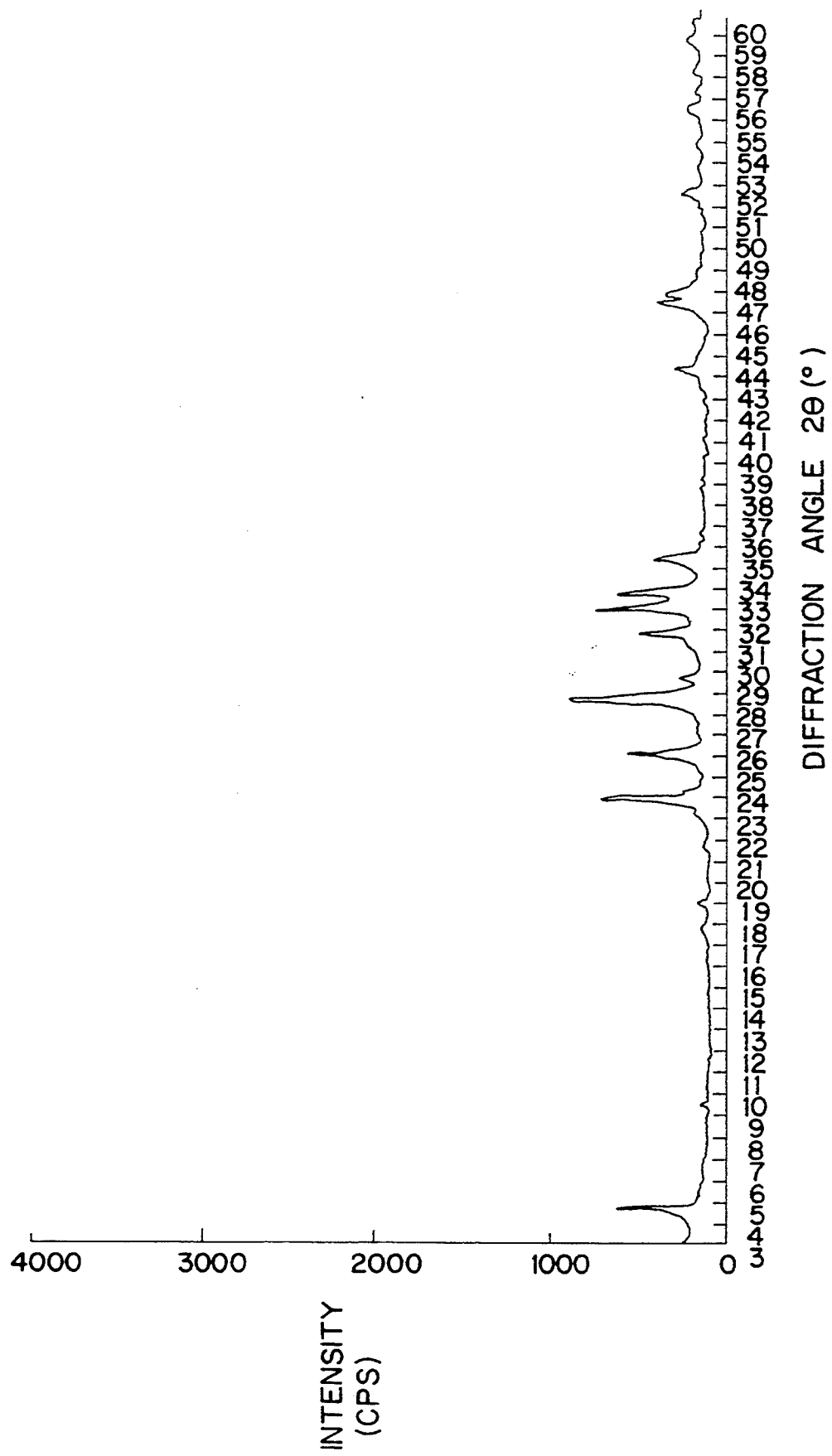
FIG. 4 is the X-ray diffraction pattern of the bismuth system oxide prepared in Example 2.
Figure 5:
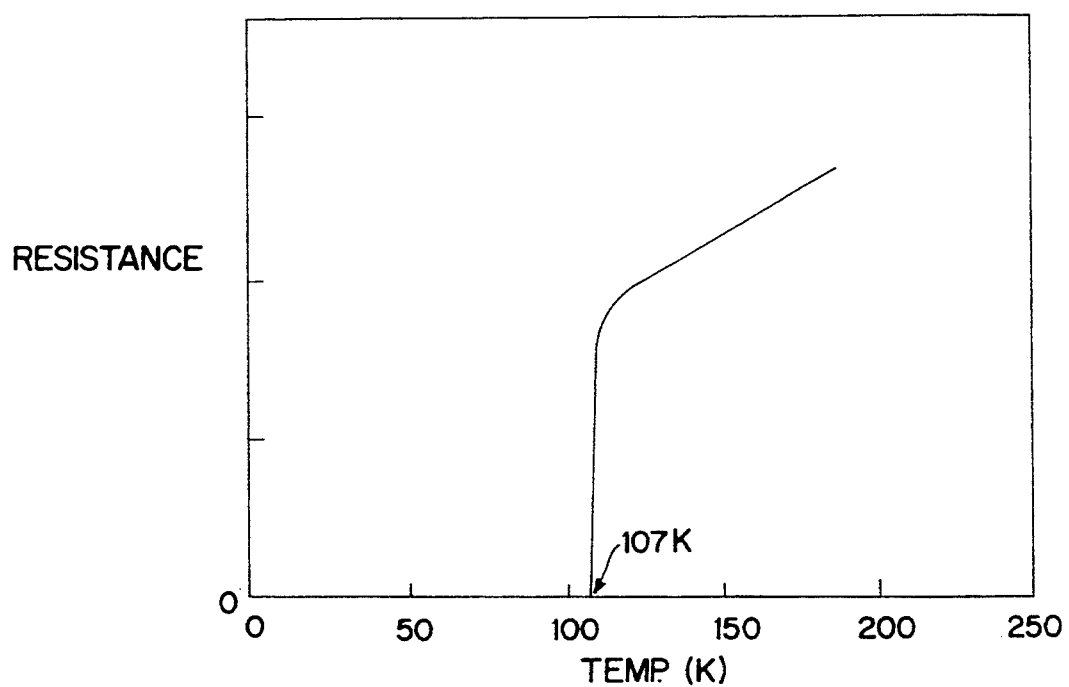
FIG. 5 is a graph showing the temperature dependency of resistance of the bismuth system oxide prepared in Example 2.
Figure 6:
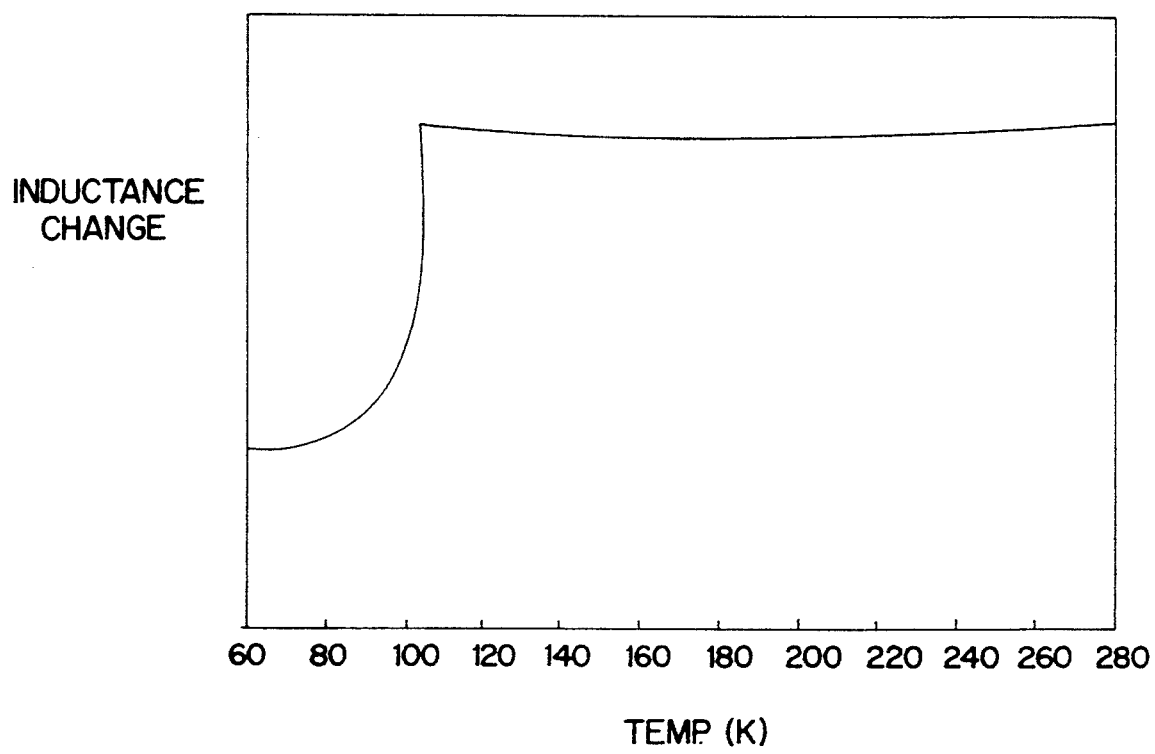
FIG. 6 is a graph showing the temperature dependency of coil inductance change caused by the bismuth system oxide prepared in Example 2.

The sintered round plate was slightly warped. This indicated that the sintering was-carried out just below the melting point. With this sintered sample, an X-ray diffraction pattern, electric resistance and the Meissner effect were measured in the same manner as in Example 1. The results are shown in FIGS. 4, 5 and 6, respectively. In the X-ray diffraction pattern, the diffraction line at $2\theta$ of 4.7° which is assigned to the 110K phase appeared but no diffraction line was found at $2\theta$ of 5.7°. The changes of the resistance and the coil inductance change near 110K were considerably large, which indicates that the most portion of the sintered plate consisted of the 110K phase.

The prior art reported that the intensity of diffraction line at $2\theta$ of 5.7° was at most 15% of that at $2\theta$ of 4.7°. Herein, the intensity of the diffraction line is a distance from the base line to the top of the line. Synthesis of a bismuth system oxide having no diffraction line at $2\theta$ of 5.7° has not been reported. In view of the detection limit of about 1% in the X-ray diffraction analysis, the produced bismuth system oxide is deemed to be the superconductive material consisting of the 110K phase only.

EXAMPLE 3

In the same manner as in Comparative Example 1, a round plate of bismuth system oxide of 13 mm in diameter and about 1 mm in thickness was produced.

Then, the plate was sintered in the same manner as in Example 1 but heating the plate at 861° C. while flowing a mixture of argon and oxygen in a volume ratio of 12:1 (corresponding to the oxygen partial pressure of 0.077 atm.) at a flow rate of 250 ml/min.

Figure 7:
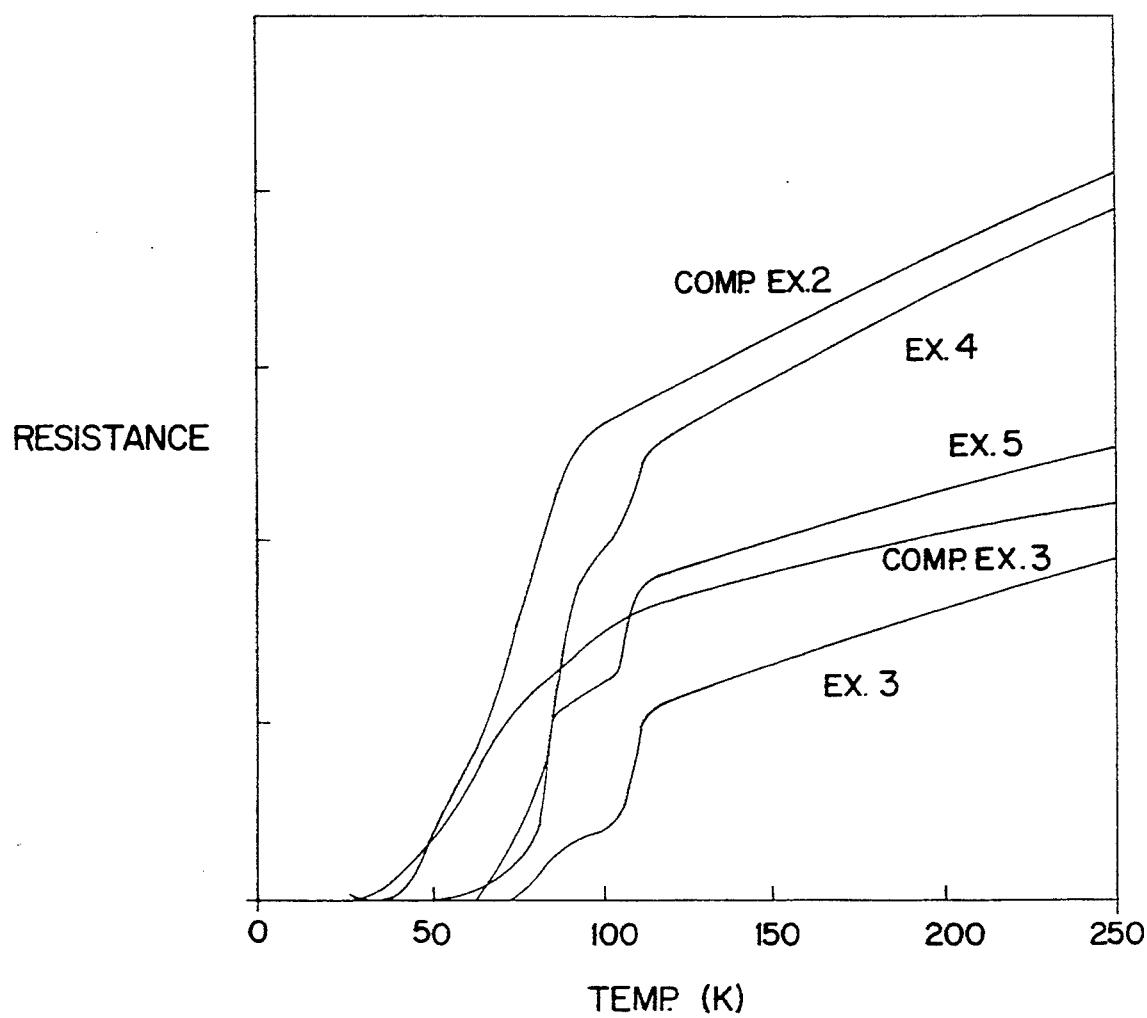
FIG. 7 is a graph showing the temperature dependency of resistance of the bismuth system oxides prepared in Examples 3, 4 and 5 and Comparative Examples 2 and 3.
Figure 8:
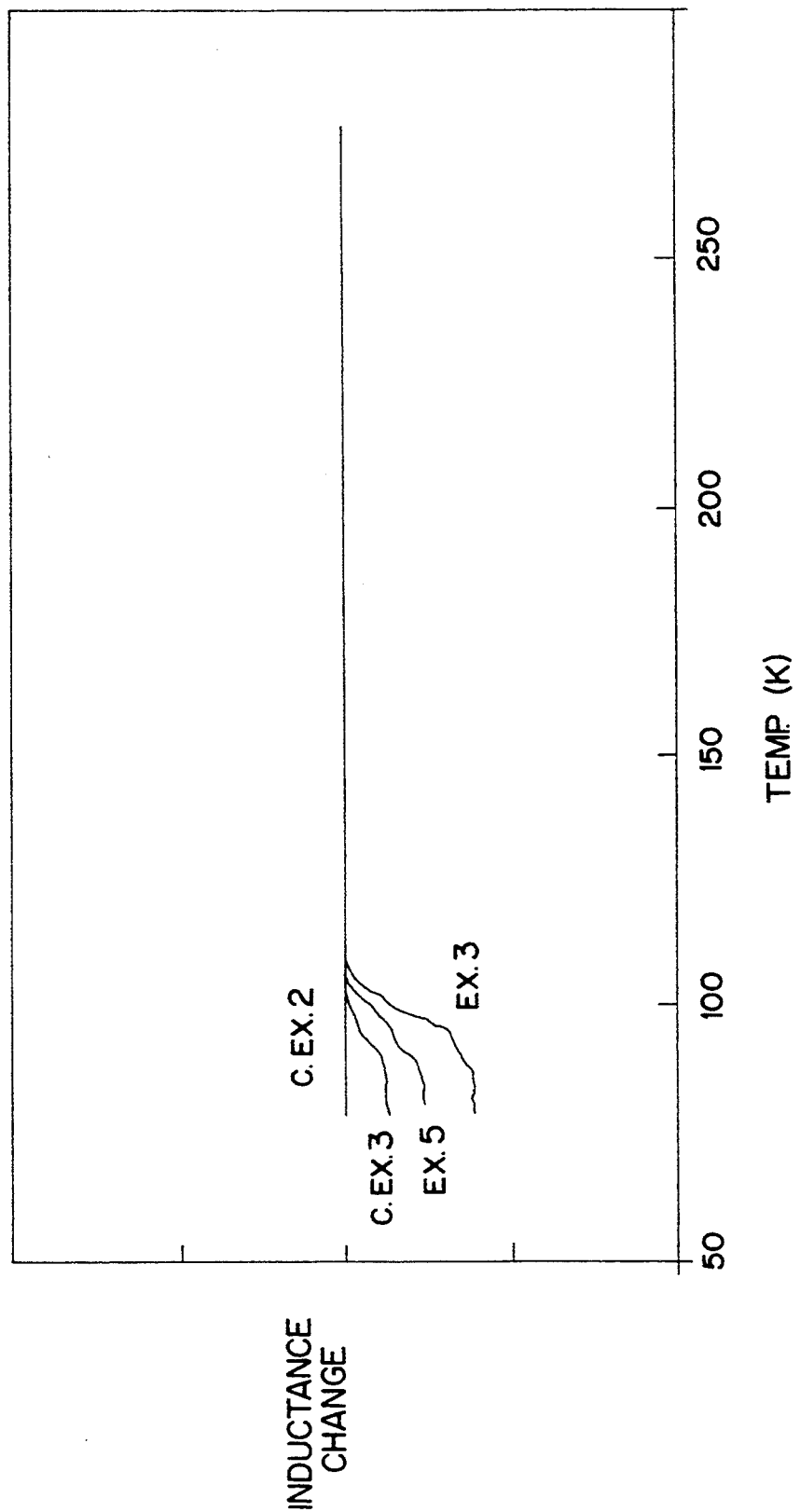
FIG. 8 is a graph showing the temperature dependency of coil inductance change caused by the bismuth system oxides prepared in Examples 3,4 and 5 and Comparative Examples 2 and 3.

The sintered round plate was slightly warped. This indicated that the sintering was carried out just below the melting point. With this sintered sample, the resistance and the Meissner effect were measured in the same manner as in Example 1. The results are shown in FIGS. 7 and 8. The sharp changes of the resistance and the induction change appeared around 110K.

EXAMPLE 4

In the same manner as in Example 3 but sintering the plate of bismuth system oxide at 830° C. while flowing a mixture of argon and oxygen in a volume ratio of 99:1 (corresponding to the oxygen partial pressure of 0.01 atm.), the sintered plate of bismuth system oxide was produced.

The sintered round plate was slightly warped. This indicated that the sintering was carried out just below the melting point. With this sintered sample, the resistance was measured in the same manner as in Example 1. The result is shown in FIG. 7. The sharp change of the resistance appeared around 110K. This indicates the formation of the 110K phase.

According to the present invention, the 110K phase can be formed at a temperature at which the 110K phase was not formed by the conventional methods.

EXAMPLE 5

In the same manner as in Example 4 but sintering the plate of bismuth system oxide at 816° C. while flowing a mixture of argon and oxygen in a volume ratio of 99:1 (corresponding to the oxygen partial pressure of 0.01 atm.), the sintered plate of bismuth system oxide was produced.

The sintered round plate was not deformed since the sintering temperature was 15° C. lower than the melting point. The resistance and coil inductance change of this sample are shown in FIGS. 7 and 8. The steep decreases of the resistance and coil inductance change were observed around 110K. It is clear that, according to the present invention, the 110K phase is formed at a comparatively low sintering temperature of 816° C.

COMPARATIVE EXAMPLE 2

In the same manner as in Example 3 but sintering the plate of bismuth system oxide at 887° C. while with flowing pure oxygen (corresponding to the oxygen partial pressure of 1 atm.), the sintered plate of bismuth system oxide was produced.

The sintered round plate was slightly warped. This indicated that the sintering temperature was just below the melting point. The resistance and coil inductance change of the sample were measured in the same manner as in Example 1. The results are shown in FIGS. 7 and 8. No decrease of the resistance and coil inductance change was observed around 110K. As understood from these results, at the high oxygen partial pressure, no or few 110K phase is created.

COMPARATIVE EXAMPLE 3

In the same manner as in Example 3 but sintering the plate of bismuth system oxide at 870° C. while with flowing a mixture of argon and oxygen in a volume ratio of 4:1 (corresponding to the oxygen partial pressure of 0.2 atm.), the sintered plate of bismuth system oxide was produced.

The sintered round plate was slightly warped. This indicated that the sintering temperature was just below the melting point. The resistance and coil inductance change of the sample were measured in the same manner as in Example 1. The results are shown in FIGS. 7 and 8. Slight decrease of the resistance and coil inductance change was observed around 110K. As understood from these results, in spite of the high sintering temperature of 870° C., only a small portion of the 110K phase is created.

EXAMPLE 6

$Bi_2O_3$, $PbO$, $SrCO_3$, $CaCO_3$ and $CuO$ were weighed so that the atomic ratio of Bi:Pb:Sr:Ca:Cu was 0.8:0.15.0.86:0.86:1.33, which corresponds to $Bi_{0.2}Pb_{0.038}$-$(Sr_{0.281}Ca_{0.281}Cu_{0.438})_{0.763}O_a$, and completely dissolved in nitric acid while heating. The solution was charged in an evaporating dish made of platinum and heated while continuously stirring to evaporate the water. In this evaporation, excess nitric acid was also removed. The mixture of nitrates was taken in an alumina crucible and further heated, whereby the nitrates were decomposed to liberate $NO_2$. The heating was continued at 800° C. until no further $NO_2$ was liberated. The mixture was ground in an agate mortar and molded in a round plate of 13 mm in diameter and about 1 mm in thickness.

Then, the plate was placed in an alumina boat and set at the center of a tubular furnace of 100 mm in inner diameter and 600 mm in length. Then, the plate was sintered at 835° C. for 12 hours with flowing a mixture of argon and oxygen in a volume ratio of 12:1 at a flow rate of 250 ml/min. The sintered plate was cooled to room temperature, ground and re-molded in a round plate having the same sizes as above. Then, the plate was sintered for 72 hours under the same conditions as above. Thereafter, the plate was cooled at a cooling rate of about 2° C./min. When the temperature reached 750° C., the atmosphere was changed to pure oxygen and the plate was cooled to room temperature.

The X-ray diffraction pattern, temperature dependency of the resistance and magnetic susceptibility of the sample were measured. The results are shown in FIGS. 9, 10 and 11.

Figure 9:
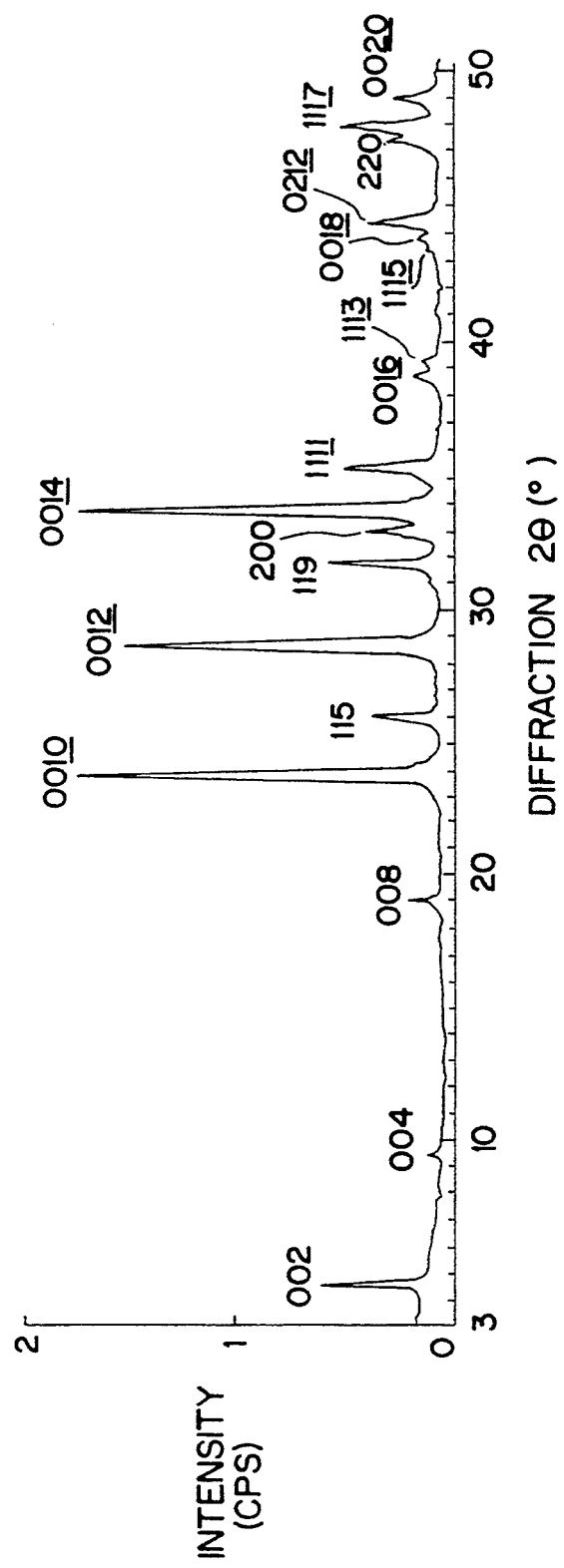
FIG. 9 is the X-ray diffraction pattern of the bismuth system oxide prepared in Example 10.
Figure 10:
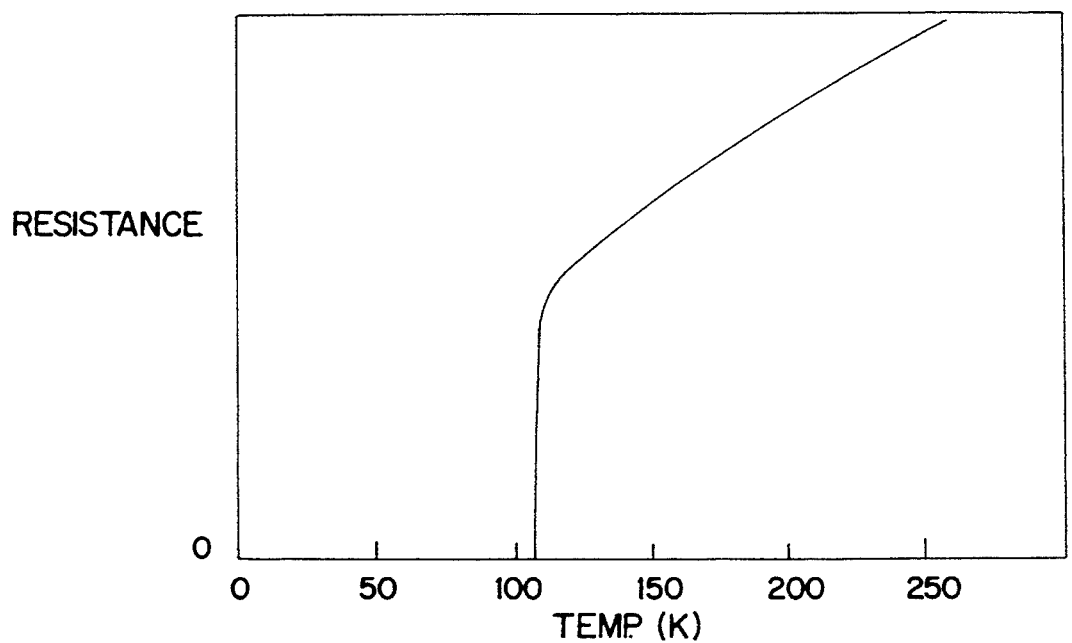
FIG. 10 is a graph showing the temperature dependency of resistance of the bismuth system oxide prepared in Example 10.

As shown in FIG. 9, the diffraction line appeared at $2\theta$ of about 4.7° and no diffraction line appeared at $2\theta$ of about 5.7° or about 7.2°. As shown in FIG. 10, the resistivity change indicates the presence of the 110K phase alone. The Meissner effect curve of FIG. 11 has two signals corresponding to the 110K and 95K phases. These two phases were contained in the volume ratio of about 1:1 and occupied about 92% of the whole volume. From these results, it can be concluded that the sample produced in this Example consisted of the 1:1 mixture of two kinds of superconductive materials both having the same structure, namely the triple Cu-O layered structure.

Figure 11:
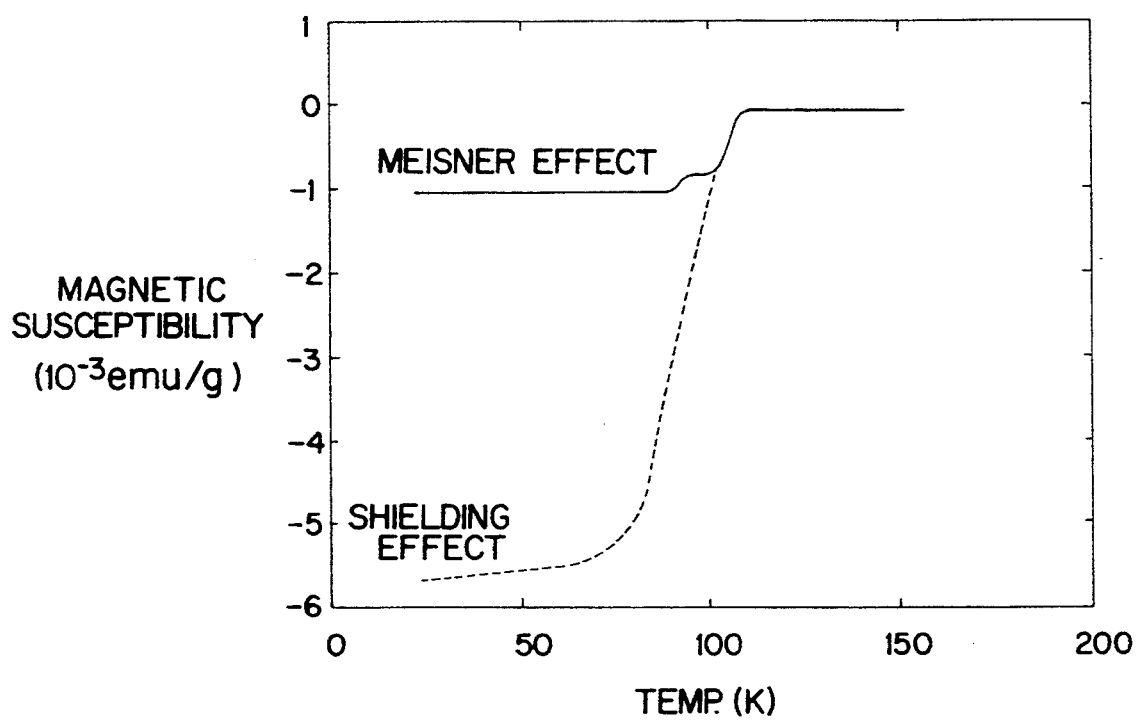
FIG. 11 is a graph showing the temperature dependency of the magnetic susceptibility of the bismuth system oxide prepared in Example 6.

The shielding effect curve in FIG. 11 should be noted. According to this result, the change of magnetic susceptibility due to the shielding effect was three times larger than that due to the Meissner effect, and such is significantly observed at 90K or lower. This means that the 95K phase has the larger shielding effect. This indicates that the pinning effect against the fluxoid quantum beam by the 95K phase is much larger than that by the 110K phase, which means the larger critical current.

EXAMPLE 7

$Bi_2O_3$, PbO, $SrCO_3$, $CaCO_3$ and CuO were weighed so that the atomic ratio of Bi:Pb:Sr:Ca:Cu was 0.8:2:0.8:1.0:2.0, which corresponds to $Bi_{0.167}Pb_{0.042}$-$(Sr_{0.211}Ca_{0.263}Cu_{0.526})_{0.7920}O_\alpha$, and thoroughly mixed in the agate mortar. The mixture was provisionally sintered at 810° C. for 10 hours. Thereafter, the grinding and the three hour provisional sintering were repeated twice. The provisionally sintered mixture was again ground and molded to obtain a round plate of 13 mm in diameter and about 1 mm in thickness. Then, the plate was sintered in the same manner as in Example 1 but heating the plate at 842° C. for 80 hours with flowing the mixture of argon and oxygen in the volume ratio of 12:1 at a flow rate of 250 ml/min. The sintered plate was gradually cooled to room temperature under oxygen partial pressure of 1/13 atm. at a cooling rate of about 2° C./min.

Figure 12:
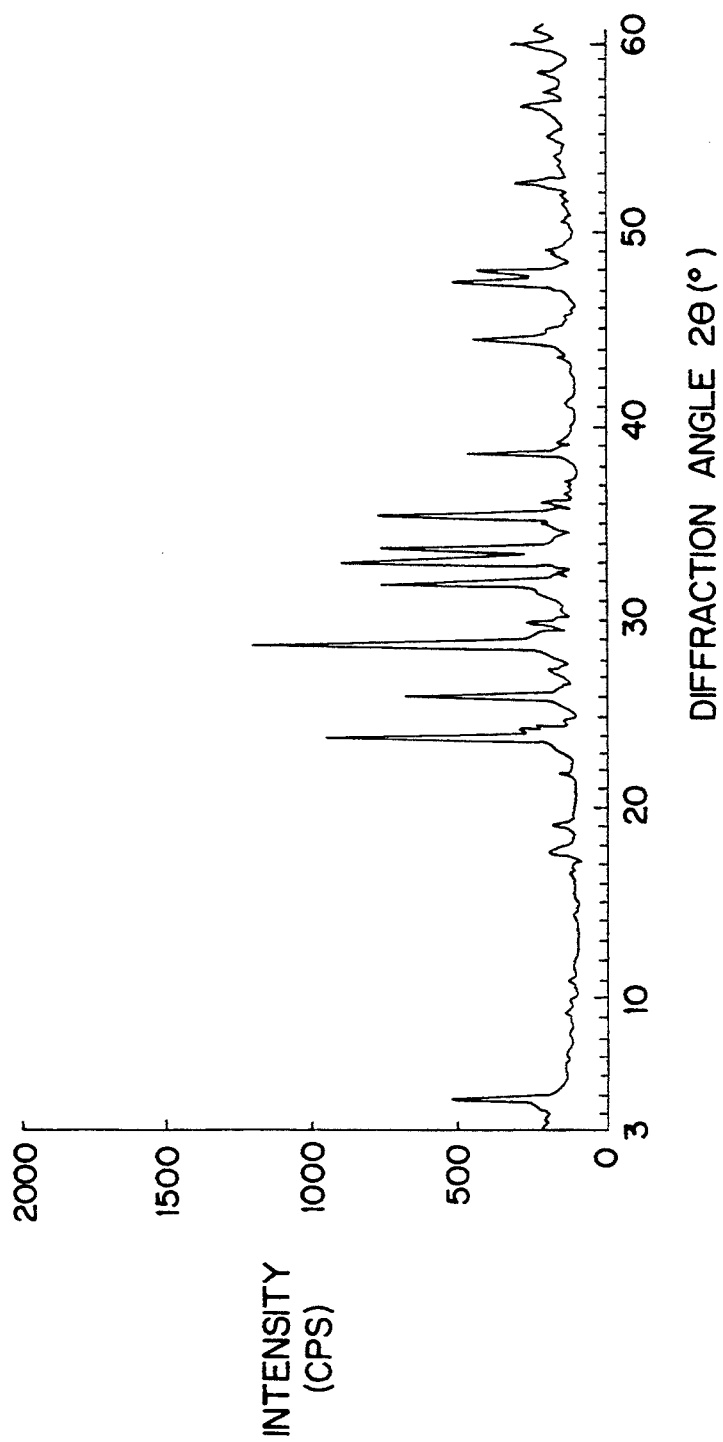
FIG. 12 is the X-ray diffraction pattern of the bismuth system oxide prepared in Example 7.

The sintered round plate was slightly warped. This indicated that the sintering was carried out just below the melting point. With this sintered sample, an X-ray diffraction pattern, resistance and coil inductance change were measured in the same manners as above. The results are shown in FIGS. 12, 13 and 14.

Figure 13:
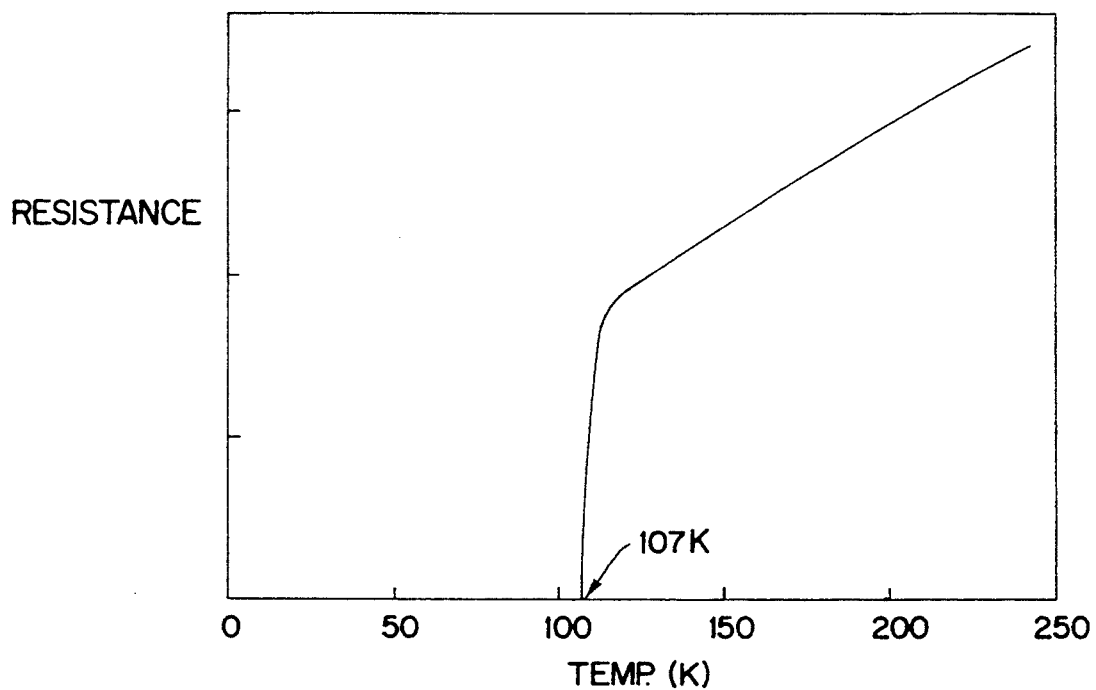
FIG. 13 is a graph showing the temperature dependency of the resistance of the bismuth system oxide prepared in Example 7.
Figure 14:
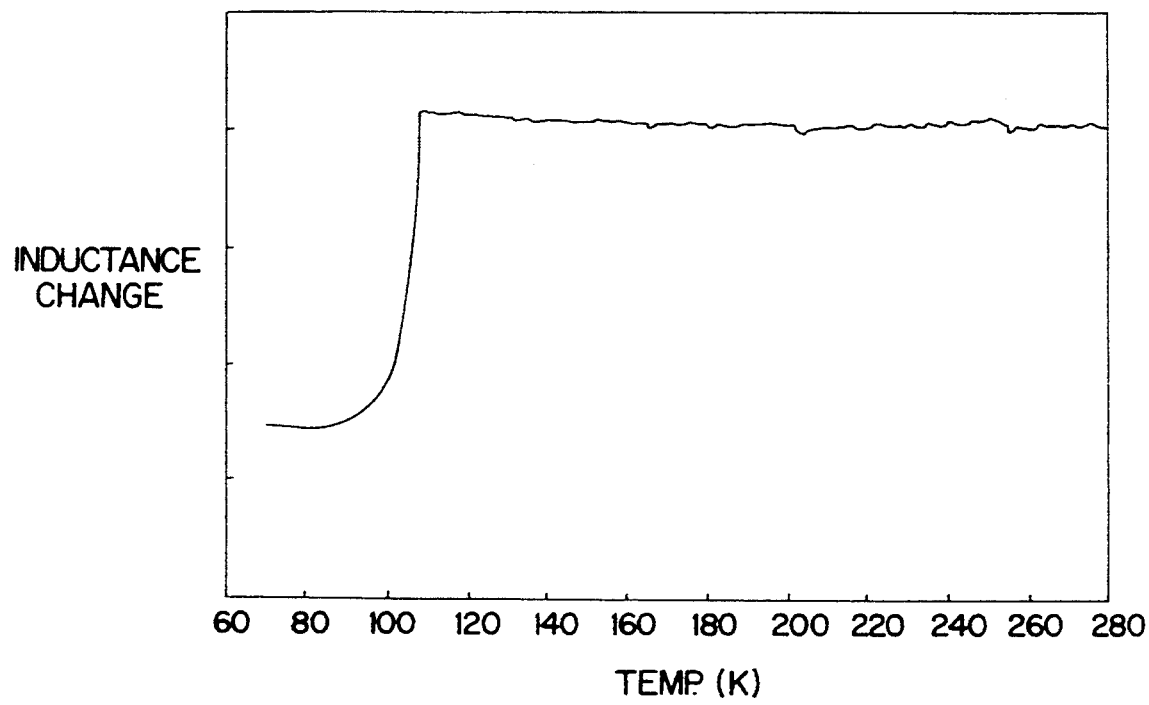
FIG. 14 is a graph showing the temperature dependency of the coil inductance changed caused by the bismuth system oxide prepared in Example 7, FIGS. 15 A-C show the X-ray diffraction patterns of the bismuth system oxides prepared in Examples 8, 9, respectively.

As shown in FIG. 13, the diffraction line appeared at $2\theta$ of about 4.7° but no diffraction line appeared at $2\theta$ of about 5.7° or about 7.2°. That is, the ratio of the intensity of the diffraction line at $2\theta$ of about 5.7° or about 7.2° was 0 (zero) % of that at $2\theta$ of about 4.7°. The resistivity steeply decreased from 110K and dropped to 0 (zero) at 107K. Correspondingly, the inductance change steeply decreased in the same temperature range. These results indicate that the proportion of the 110K phase was large in the bismuth system oxide superconductor obtained in this Example.

EXAMPLES 8–10

$Bi_2O_3$, PbO, $SrCO_3$, $CaCO_3$ and CuO were weighed so that the atomic ratio of Bi:Pb:Sr:Ca:Cu was 0.8:0.2:0.8:1.0:1.4, which corresponds to $Bi_{0.190}Pb_{0.048}$-$(Sr_{0.250}Ca_{0.313}Cu_{0.438})_{0.762}O_\alpha$, and thoroughly mixed in the agate mortar. The mixture was sintered in the same manners as in Example 6 but adjusting the sintering temperature, the sintering time and oxygen partial pressure as indicated in Table 1 and maintaining the same oxygen partial pressure during cooling.

Figure 15C:
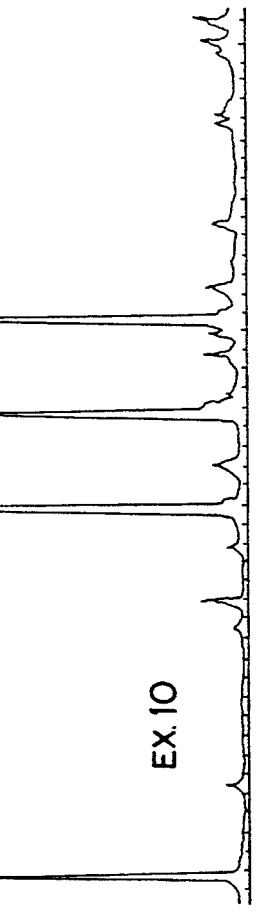
Figure 15B:
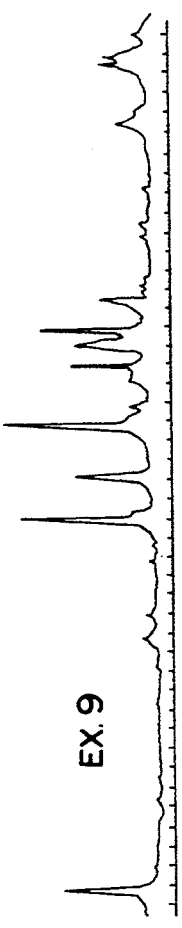
Figure 15A:
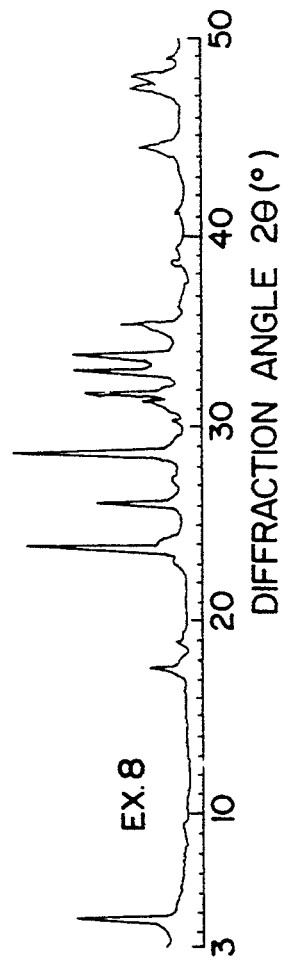

The X-ray diffraction patterns of the samples obtained in Examples 8–10 are shown in FIGS. 15A–15C, respectively. The diffraction line appeared at $2\theta$ of about 4.7° but no or very weak diffraction line appeared at $2\theta$ of about 5.7° or about 7.2°. This indicates that the proportion of the 110K phase or the 95K phase was large in each sample.

TABLE 1

| Example No. | Sintering temp. (°C.) | Sintering time (hrs.) | Partial pressure of $O_2$ | Intensity ratio*[1] of diffraction line 5.7° | 7.2° |
|---|---|---|---|---|---|
| 8 | 842 | 36 | 0.2 | 1.3 | 1.3 |
| 9 | 828 | 36 | 0.077 | 0.0 | 0.0 |
| 10 | 842 | 84 | 0.077 | 0.0 | 0.0 |

Note:
*[1]The ratio to the intensity of diffraction line at $2\theta$ of 4.7°.

EXAMPLE 11

$Bi_2O_3$, PbO, $SrCO_3$, $CaCO_3$ and CuO were weighed so that the atomic ratio of Bi:Pb:Sr:Ca:Cu was 0.8:0.15:0.83:0.89:1.33, which corresponds to $Bi_{0.2}Pb_{0.0375}$-$(Sr_{0.272}Ca_{0.292}Cu_{0.436})_{0.7625}O_\alpha$ nd thoroughly mixed in the agate mortar. The mixture was sintered in the same manners as in Example 6 but maintaining the same oxygen partial pressure during cooling.

Figure 16:
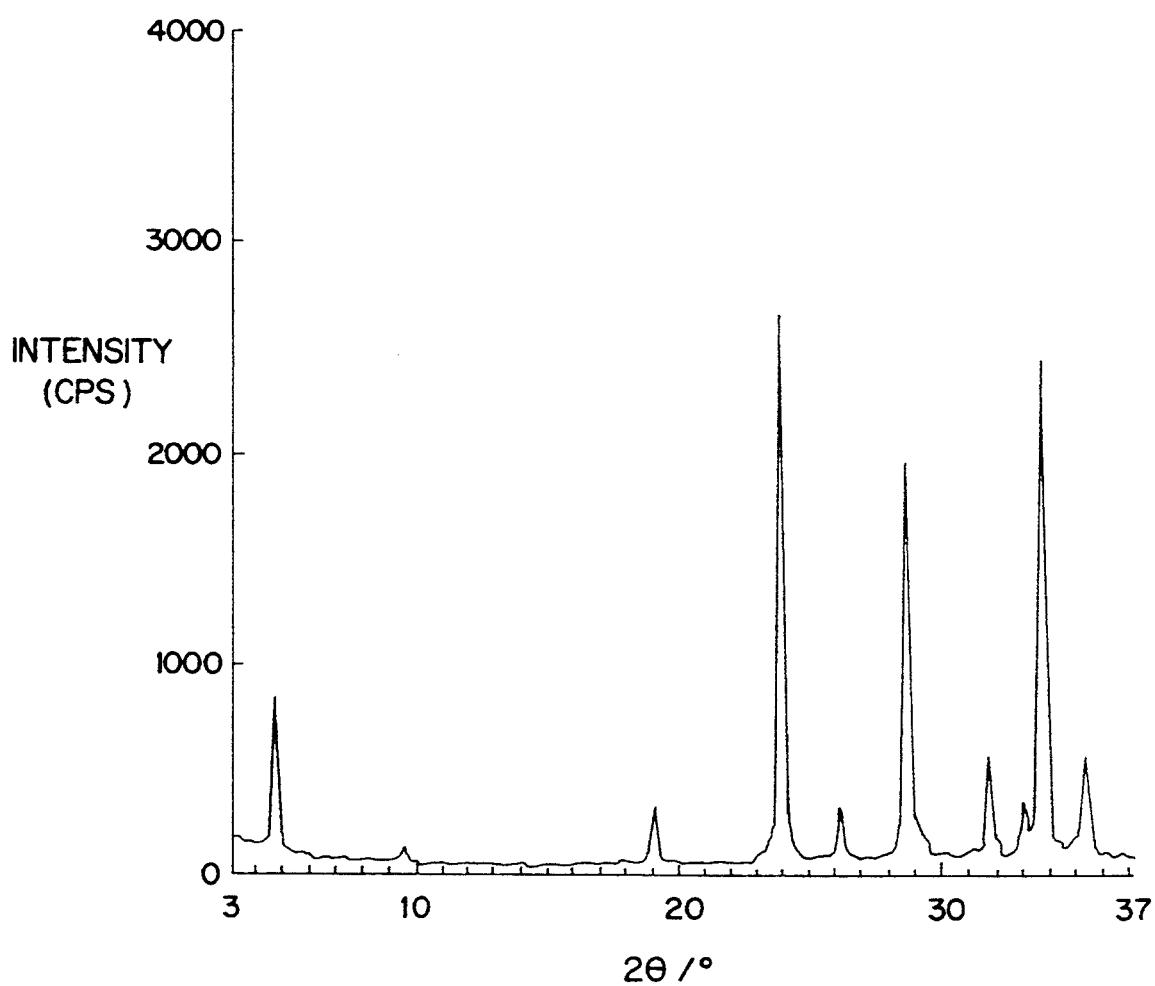
FIG. 16 is the X-ray diffraction pattern of the bismuth system oxide prepared in Example 11.

The X-ray diffraction pattern of this sample is shown in FIG. 16. The strong diffraction line appeared at $2\theta$ of about 4.7° but no diffraction line appeared at $2\theta$ of about 5.7° or about 7.2°. That is, the ratio of the intensity of the diffraction line at $2\theta$ of about 5.7° or about 7.2 was 0 (zero) % of that at $2\theta$ of about 4.7°. While in Examples 8–10, a weak line appeared in the $2\theta$ range of 17°–18°, which was assigned to impurities, in this Example, no diffraction line at $2\theta$ of 17.8°, 16.5° or 29.9° which is to be assigned to impurities was found. This indicates that the sample of this Example would be a superconductive material consisting of the Cu-O layered structure.

EXAMPLES 12 AND 13

In the same manner as in Example 17 except that the raw materials were weighed so that the material had the composition of $Bi_{0.200}Pb_{0.037}(Sr_{0.259}Ca_{0.303}Cu_{0.438})_{0.7630}O_\alpha$ (Example 12) or $Bi_{0.200}Pb_{0.037}(Sr_{0.245}Ca_{0.330}Cu_{0.425})_{0.7630}O_\alpha$ (Example 13), the bismuth system oxide material was prepared.

Figure 17:
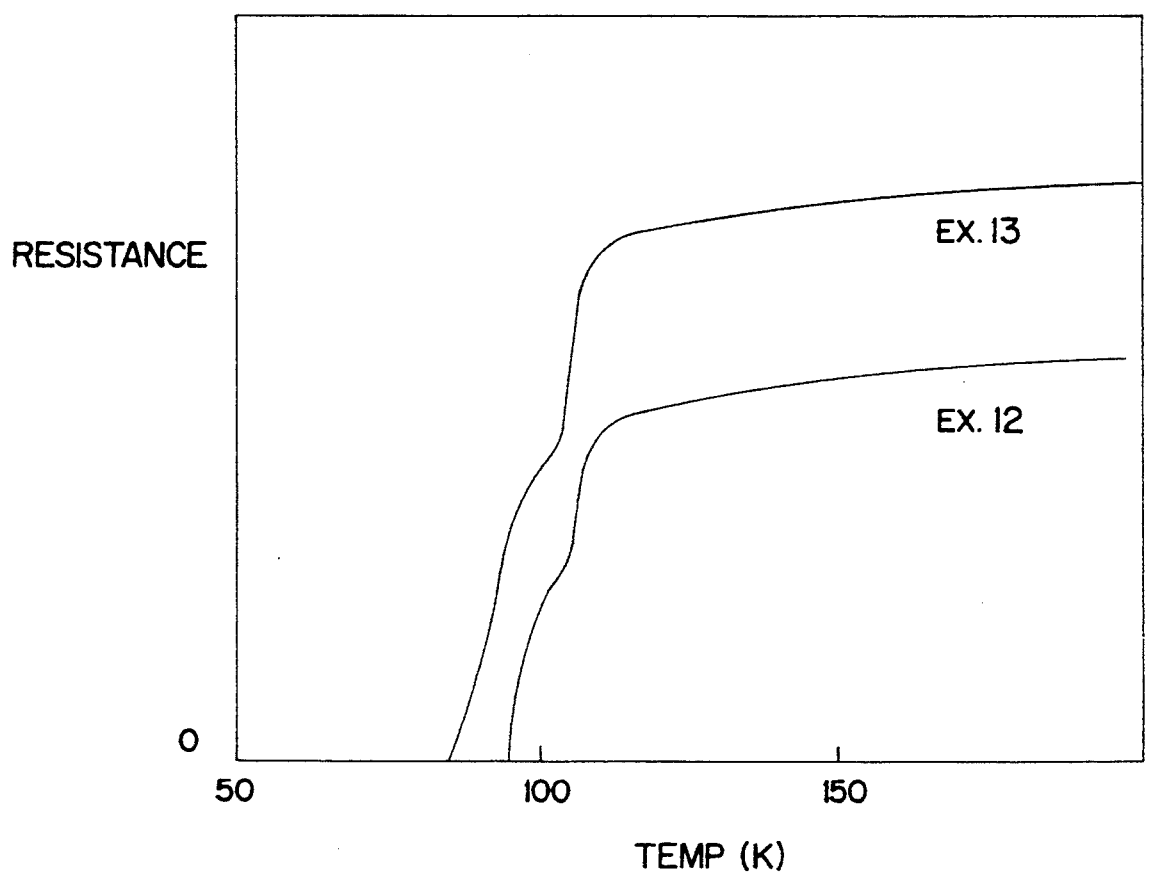
FIG. 17 shows the temperature dependency of the electric resistance of the bismuth system oxides produced in Examples 12 and 13.

With these samples, the temperature dependency of electric resistance was examined. The results are shown in FIG. 17. Apparent decrease of resistance due to the 95K phase was found at 95K, while such decrease was not found in Example 10.

Diffraction lines appeared at $2\theta$ of about 5.7° and about 7.2° with the strength ratio of 2% and 9%, respectively to that of the diffraction line at $2\theta$ of about 4.7°. Despite of the appearance of the diffraction lines at $2\theta$ of about 5.7° and about 7.2°s, no 80K phase was identified from the resistance-temperature curve of FIG. 17. The reason for this may be the 110K phase and the 95K phase being linked continuously.

COMPARATIVE EXAMPLES 4–8

In the same manner as in Example 7 but weighing $Bi_2O_3$, PbO, $SrCO_3$, $CaCO_3$ and CuO so that the atomic ratio of Bi:Pb:Sr:Ca:Cu was as indicated in Table 2 and maintaining the same oxygen partial pressure during cooling, the bismuth system oxide materials designated as comparative examples 4–8 were prepared.

The X-ray diffraction patterns of comparative examples 4–8 are shown in FIGS. 18A–E, respectively. The strong diffraction line appeared at $2\theta$ of about 4.7°. Further, at $2\theta$ of about 5.7°, a diffraction line to be assigned to the 80K phase as well as those assigned to the impurities appeared. This indicates that the prepared material did not consist of the triple Cu-O layered structure alone.

TABLE 2

| Comp. Example No. | In $Bi_xPb_y(Sr_uCa_vCu_w)_zO_\alpha$ | | | | | | Intensity ratio*1 diffraction line at $2\theta$ of 5.7° |
|---|---|---|---|---|---|---|---|
| | x | y | z | u | v | w | |
| 4 | 0.200 | 0.037 | 0.763 | 0.277 | 0.294 | 0.429 | 19.9 |
| 5 | 0.200 | 0.037 | 0.763 | 0.292 | 0.271 | 0.437 | 30.3 |
| 6 | 0.217 | 0.022 | 0.761 | 0.285 | 0.285 | 0.431 | 24.4 |
| 7 | 0.200 | 0.037 | 0.763 | 0.294 | 0.284 | 0.421 | 80.2 |
| 8 | 0.196 | 0.027 | 0.777 | 0.286 | 0.286 | 0.439 | 32.6 |

Note:
*1 The ratio to the intensity of diffraction line at $2\theta$ 4.7°.

What is claimed is:

1. A process for producing a bismuth system oxide superconductor, which comprises
   mixing a bismuth compound, a strontium compound, a calcium compound, and a copper compound, and
   sintering the mixture in an atmosphere that has an oxygen partial pressure in the range of 0.01 to 0.15 atm.

2. The process according to claim 1, wherein at least the copper compound is copper nitrate, and all the compounds are dissolved or dispersed in a medium, the medium is removed and then the nitrate is thermally decomposed to mix the compounds homogeneously.

3. The process according to claim 2, wherein all the compounds are nitrates, and the nitrates are dissolved in a medium, the medium is removed and then the nitrates are thermally decomposed to mix the compounds homogeneously.

4. The process according to claim 1, wherein said mixing step further includes mixing a lead compound.

5. The process according to claim 2, wherein the temperature used to effect said thermal decomposition is in the range of 800° to 840° C.

6. The process according to claim 1, wherein said oxygen partial pressure is in the range of 0.03 to 0.1 atm.

7. The process according to claim 1, wherein said sintering step is carried out at a temperature, T, which is within the range $$(T_{mp}-50°\ C.) \leqq T < (T_{mp})$$

wherein $T_{mp}$ is the melting point of said mixture.

8. The process according to claim 1, wherein said sintering step is carried out for at least 2 hours.

9. The process according to claim 1, wherein said sintering step is carried out for at least 8 hours.

10. The process according to claim 1, wherein said sintering step is carried out for at least 12 hours.

11. The process according to claim 7, wherein said sintering step is carried out for at least 12 hours.

12. The process according to claim 1, further comprising cooling the bismuth system oxide superconductor after said sintering step, in an atmosphere having an oxygen partial pressure that is greater than the oxygen partial pressure present during said sintering step.

13. A process for producing a bismuth system oxide superconductor, which comprises the following steps:
   (1) heating an aqueous solution which comprises bismuth nitrate, strontium nitrate, calcium nitrate and copper nitrate until dry;
   (2) heating the dried nitrate compounds produced in step (1) at a temperature sufficiently high so as to decompose said nitrate compounds and liberate $NO_2$ and for a sufficient duration so that no further $NO_2$ is liberated; and
   (3) sintering the mixture produced in step (2) in an atmosphere form a bismuth system oxide superconductor.

* * * * *